United States Patent
LeMieux et al.

(10) Patent No.: US 8,524,525 B2
(45) Date of Patent: Sep. 3, 2013

(54) JOINED NANOSTRUCTURES AND METHODS THEREFOR

(75) Inventors: Melburne C. LeMieux, La Honda, CA (US); Ajay Virkar, Stanford, CA (US); Zhenan Bao, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 335 days.

(21) Appl. No.: 13/011,352

(22) Filed: Jan. 21, 2011

(65) Prior Publication Data

US 2011/0204330 A1    Aug. 25, 2011

Related U.S. Application Data

(60) Provisional application No. 61/298,035, filed on Jan. 25, 2010, provisional application No. 61/298,043, filed on Jan. 25, 2010.

(51) Int. Cl.
*H01L 51/40*    (2006.01)

(52) U.S. Cl.
USPC ........ 438/99; 257/E51.04; 977/734; 977/742; 977/932

(58) Field of Classification Search
USPC ............. 438/99; 257/E51.04; 977/734, 742, 977/932
See application file for complete search history.

(56) References Cited

U.S. PATENT DOCUMENTS

| | | |
|---|---|---|
| 5,380,703 A | 1/1995 | Kao et al. |
| 5,416,243 A | 5/1995 | Bekiarian et al. |
| 5,558,903 A | 9/1996 | Bhushan et al. |
| 6,386,468 B1 | 5/2002 | Neuberger et al. |
| 6,890,676 B2 | 5/2005 | Nuber et al. |
| 7,060,241 B2 | 6/2006 | Glatkowski |
| 7,122,710 B2 | 10/2006 | Margrave et al. |
| 7,129,003 B2 | 10/2006 | Cagle |
| 7,261,852 B2 | 8/2007 | Rinzler et al. |
| 7,531,157 B2 | 5/2009 | Ford et al. |
| 7,535,462 B2 | 5/2009 | Spath et al. |
| 7,604,757 B2 | 10/2009 | Yasuda |
| 8,119,445 B2 | 2/2012 | Vikar et al. |
| 2003/0089899 A1 | 5/2003 | Lieber et al. |
| 2004/0004212 A1 | 1/2004 | Crespi et al. |
| 2004/0142172 A1 | 7/2004 | Sugiyama et al. |

(Continued)

FOREIGN PATENT DOCUMENTS

| | | |
|---|---|---|
| WO | WO 2007/057501 | 5/2007 |
| WO | WO 2010/029542 | 3/2010 |

OTHER PUBLICATIONS

A.M. Morales and C.M. Lieber, "A Laser Ablation Method for the Synthesis of Crystalline Semiconductor Nanowires," Science, vol. 279, pp. 208-210, (Jan. 1998).

(Continued)

*Primary Examiner* — Minh-Loan T Tran
(74) *Attorney, Agent, or Firm* — Crawford Maunu PLLC

(57) ABSTRACT

Nanostructures are joined using one or more of a variety of materials and approaches. As consistent with various example embodiments, two or more nanostructures are joined at a junction between the nanostructures. The nanostructures may touch or be nearly touching at the junction, and a joining material is deposited and nucleates at the junction to couple the nanostructures together. In various applications, the nucleated joining material facilitates conductivity (thermal and/or electric) between the nanostructures. In some embodiments, the joining material further enhances conductivity of the nanostructures themselves, such as by growing along the nanostructures and/or doping the nanostructures.

56 Claims, 10 Drawing Sheets

(56) References Cited

U.S. PATENT DOCUMENTS

| | | |
|---|---|---|
| 2004/0194705 A1 | 10/2004 | Dai et al. |
| 2004/0265550 A1 | 12/2004 | Glatkowski et al. |
| 2005/0130395 A1 | 6/2005 | Tada et al. |
| 2006/0067870 A1 | 3/2006 | Park et al. |
| 2007/0108439 A1 | 5/2007 | Silverbrook |
| 2007/0108480 A1 | 5/2007 | Nanai et al. |
| 2007/0137786 A1 | 6/2007 | Luzzi |
| 2007/0243124 A1 | 10/2007 | Baughman et al. |
| 2007/0255002 A1 | 11/2007 | Alba |
| 2008/0001141 A1 | 1/2008 | Gruner et al. |
| 2008/0017847 A1 | 1/2008 | Darsey et al. |
| 2008/0170982 A1 | 7/2008 | Zhang et al. |
| 2008/0191606 A1 | 8/2008 | Geohegan et al. |
| 2008/0203380 A1 | 8/2008 | Wang et al. |
| 2008/0210052 A1 | 9/2008 | Allemand |
| 2008/0210370 A1 | 9/2008 | Smalley |
| 2008/0241262 A1 | 10/2008 | Lee et al. |
| 2008/0259262 A1 | 10/2008 | Jones et al. |
| 2009/0155460 A1 | 6/2009 | Ruoff |
| 2009/0226704 A1 | 9/2009 | Kauppinen et al. |
| 2009/0228131 A1 | 9/2009 | Wolk et al. |
| 2009/0320911 A1 | 12/2009 | Ruoff |
| 2010/0001255 A1 | 1/2010 | Bao et al. |
| 2010/0003781 A1 | 1/2010 | Van Duren et al. |
| 2010/0012923 A1 | 1/2010 | Hiura et al. |
| 2011/0204319 A1 | 8/2011 | Vikar et al. |

OTHER PUBLICATIONS

C. Journet et al., "Large-scale production of single-walled carbon nanotubes by the electric-arc technique," Letters to Nature, vol. 388, pp. 756-758, (Aug. 1997).

C.L. Cheung et al., "Diameter-Controlled Synthesis of Carbon Nanotubes," The Journal of Physical Chemistry B, vol. 106, No. 10, pp. 2429-2433, (Feb. 2002).

A.A. Puretzky et al., "Investigations of single-wall carbon nanotube growth by time-restricted laser vaporization," The American Physical Society Review B, vol. 65, No. 24, pp. 245425, (Jun. 2002).

M. Terrenes et al., "Molecular Junctions by Joining Single-Walled Carbon Nanotubes," Physical Review Letters, vol. 89, No. 7, pp. 1-4, (Aug. 2002).

D.N. Madsen et al., "Soldering of Nanotubes into Microelectrodes," Nano Letters, vol. 3, No. 1, pp. 47-49, (Sep. 2002).

B.I. Yakobson et al., "Carbon Nanotubes: Supramolecular Mechanics," Dekker Encycl. of Nanoscience and Nanotechnology, pp. 587-601 (2004).

F. Banhart, "Formation and transformation of carbon nanoparticles under electron irradiation," Philosophical Transactions of the Royal Society A, vol. 362, No. 1823, pp. 2205-2222, (Oct. 2004).

N. P. Armitage et al., "Quasi-Langmuir-Blodgett thin film deposition of carbon nanotubes," Journal of Applied Physics, vol. 95, No. 6, pp. 3228-3230, (Mar. 2004).

M. Stadermann et al., "Nanoscale study of conduction through carbon nanotube networks", Phys. Rev. B, vol. 69, pp. 201402, 1-3, (2004).

M.Kaempgen et al., "Transparent carbon nanotube coatings," Applied Surface Science, vol. 252, pp. 425-429, (Feb. 2005).

C.M. Trottier et al., "Properties and characterization of carbon-nanotube-based transparent conductive coating," Proc. Soc. Inf. Display, vol. 13, No. 9, pp. 759-763, (2005).

J. Vavro et al., "Metal-insulator transition in doped single-wall carbon nanotubes," Phys. Rev. B, vol. 71, No. 15, pp. 155410, 1-11, (2005).

J.S. Moon et al., "Transparent conductive film based on carbon nanotubes and PEDOT composites," Diamond and Related Materials, vol. 14, No. 11-12, pp. 1882-1887, (2005).

M.C. LeMieux et al., "Polymeric nanolayers as actuators for ultrasensitive thermal bimorphs," Nano Letters, vol. 6, No. 4, pp. 730-734, (Apr. 2006).

J.C. Miller and D.L. Harris, "The Carbon Nanotube Patent Landscape," Nanotechnology Law & Business, vol. 3, No. 4, pp. 427-454, (Dec. 2006).

Y.-X. Zhou, et al., "A method of printing arbon nanotube thin films," Appl. Phys. Lett., vol. 88, pp. 123109, 1-3, (2006).

A.R. Boccaccino, et al., "Electrophoretic deposition of carbon nanotubes," Carbon, vol. 44, pp. 3149-3160, (2006).

Y.-S. Lee and N. Marzari, "Cycloaddition functionalizations to preserve or control the conductance of carbon nanotubes," Phys. Rev. Lett., vol. 97, No. 11, pp. 116801, 1-4, (2006).

M.A. Kuroda and J.-P. Leburton, "Joule heating induced negative differential resistance in freestanding metallic carbon nanotubes," Appl. Phys. Lett., vol. 89, pp. 103102, 1-3, (2006).

A.G. Nasibulin et al., "A novel hybrid carbon material," Nature Nanotechnology, vol. 2, pp. 156-161, (Feb. 2007).

A.V. Krasheninnkov and F. Banhart, "Engineering of nanostructured carbon materials with electron or ion beams," Nature Materials, vol. 6, pp. 723-733, (2007).

M.C. LeMieux et al., "Self-sorted, aligned nanotube networks for thin-film transistors," Science, vol. 321, No. 27, pp. 101-104, (Jul. 2008).

H. Chaturvedi, "Photon Induced Effects in Molecular Assemblies of Single Walled Carbon Nanotubes," Dissertation online, pp. 1-56 (Dec. 2008).

S.L. Hellstrom et al., "Polymer-assisted Direct Deposition of Uniform Carbon Nanotube Bundle Networks for High Performance Transparent Electrodes," American Chemical Society Nano, vol. 3, No. 6, pp. 1423-1430, (May 2009).

J. Hart, "Organization and properties of nanostructure networks," Nanomanufacturing, University of Michigan, 46 pgs. (Apr. 2009).

L.B. Johnson Space Center and J.H. Glenn Research Center, "Progress Toward Sequestering Carbon Naotubes in PmPV," "Computer Code for Nanostructure Simulation," "Functionalizing CNTs for Making Epoxy/CNT Composites," "Improvements in Production of Single-Walled Carbon Nanotubes," NASA Tech Briefs, (Sep. 2009).

A. Ishaq et al., "The electrical conductivity of carbon nanotube sheets by ion beam irradiation," Nuclear Instruments and Methods in Physics Research B, vol. 267, pp. 1779-1782, (2009).

A. Velamakanni et al., "Site-Specific Deposition of Au Nanoparticles in CNT Films by Chemical Bonding," American Chemical Society Nano, vol. 4, No. 1, pp. 540-546, (Jan. 2010).

JOINED NANOSTRUCTURES AND METHODS THEREFOR

RELATED PATENT DOCUMENTS

This patent document claims benefit under 35 U.S.C. §119 to U.S. Provisional Patent Application Ser. No. 61/298,035, entitled "Nanostructures" and filed with an Appendix on Jan. 25, 2010; this patent document also claims benefit under 35 U.S.C. §119 to U.S. Provisional Patent Application Ser. No. 61/298,043, entitled "Fullerene-Doped Nanostructures" and also filed on Jan. 25, 2010; each of these Provisional Patent Applications and the Appendix are fully incorporated herein by reference.

FEDERALLY-SPONSORED RESEARCH AND DEVELOPMENT

This invention was made with Government support under contracts HM1582-07-1-2009 awarded by the National Geospatial-Intelligence Agency and 0213618 awarded by the National Science Foundation. The U.S. Government has certain rights in this invention.

FIELD

The present invention relates generally to nanostructures, developing materials through nano-assembly, and more specifically, to joined nanostructures and methods therefor, and application of such nanostructures as conductive films in electrode and other applications.

BACKGROUND

Nanostructures, such as carbon nanotube (CNT)-based materials, have been increasingly used in a multitude of disparate applications. For example, some CNT-based applications have involved a thin, sub-monolayer network of interconnected CNTs. These electronically conducting films can be highly transparent due to their nano-scale thickness (e.g., <50 nm), and represent a unique class of materials for transparent electrodes and many other applications.

While nanomaterial structures such as CNT networks have been used in certain applications, their use has been limited in many applications such as those benefiting from or requiring high levels of transparency and conductivity. For example, various high-end applications such as displays and photovoltaics often benefit from the use of one or more electrodes that possess high optical transparency and high conductivity. Achieving such transparency and conductivity levels with nanomaterials such as CNT networks has been challenging due to a variety of factors, such as those involving the formation of CNT networks and variations in the characteristics of nanomaterials such as CNTs (e.g., chiralities, diameters). Moreover, junctions between nanostructures can be highly resistive. In addition, modifying nanomaterials to achieve desired properties has been burdensome or otherwise difficult, is oftentimes temporary, commonly involves toxic materials, and can be expensive.

These and other issues remain challenges to a variety of methods, devices and systems that use or benefit from nanostructures.

SUMMARY

Various aspects of the present invention are directed to devices, methods, materials, and systems involving nanostructures that address challenges including those discussed above.

According to an example embodiment, a joining material is deposited at a junction between nanostructures, where the junction may involve crossing, adjacent, touching, or nearly-touching nanostructures. The joining material is nucleated to form a nucleated material between the nanostructures to physically, and in some instances, electrically-couple the nanostructures together.

Another example embodiment is directed to a method for joining nanostructures by depositing a molecular joining material between the nanostructures. The joining material is nucleated at the junction to form a nucleated material between the nanostructures and physically couple the nanostructures together.

Another example embodiment is directed to joining nanostructures to form a nanomaterial film. A joining material is deposited at junctions between nanostructures and nucleated. The nucleated joining material forms conductive material at each of the junctions to physically couple the nanostructures together to form the nanomaterial film, and can further dope the nanostructures. The dopant material in the joining material effectively reduces a resistance value of the nanostructures relative to a resistance value of the nanostructures, prior to doping the nanostructures (e.g., electrical/thermal conductivity is enhanced).

According to another example embodiment, carbon-based nanostructures are joined to form an organic-based nanomaterial film. A joining material is deposited at junctions between a plurality of carbon-based nanostructures, and the joining material is nucleated (the junctions serve as a nucleation site). The nucleated joining material forms charge transport structures at each of the junctions to physically couple the carbon-based nano structures, and to electrically couple the carbon-based nanostructures, to form the organic nanomaterial film. The nucleated joining material also forms a hybrid material on sidewalls of the carbon-based nanostructures, where the hybrid material includes a material from the carbon-based nanostructures and a dopant from the joining material, and reduces a resistance value of the carbon-based nanostructures (relative to the nanostructures' resistance, prior to formation of the hybrid material).

Other example embodiments are directed to films, circuits and devices using joined nanomaterials, such as discussed above. One such embodiment is directed to a transparent electronic circuit having a plurality of nanostructures, with a nucleated joining material at junctions (physical or gaps) between the nanostructures. The nucleated joining material physically and electrically couples the nanostructures at the junctions.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

FIGS. 2A-2C show nanostructures at various stages of manufacture and in accordance with one or more example embodiments, in which FIG. 2A shows nanotubes arranged for joining, FIG. 2B shows the nanotubes with a joining material having been deposited at junctions between the nanotubes, and FIG. 2C shows nanotubes joined with a nucleated joining material;

Figure 1:
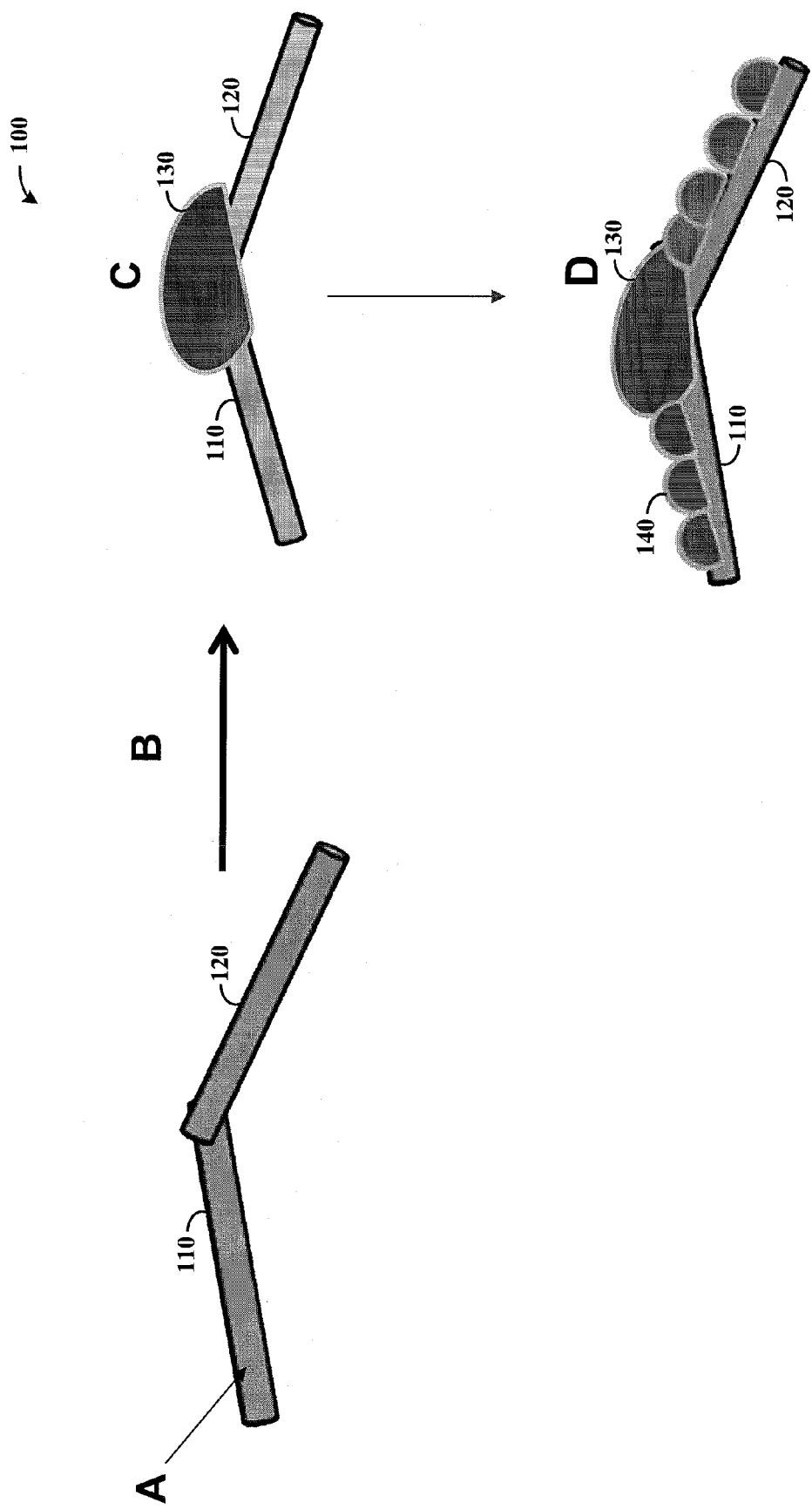
FIG. 1 shows a nanostructure 100 at various stages of a joining process, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to joining nanomaterials as described herein, such as to join films of nanostructures, to a nanostructured based film supported by a substrate, or to an aggregate of nanostructures. While the present invention is not necessarily limited, various aspects of the invention may be appreciated through a discussion of examples using these and other contexts.

According to an example embodiment, a joining (e.g., additive) material is deposited at a junction between nanostructures, and the joining material is nucleated to form a nucleated material that physically couples the nanostructures together (e.g., to connect and/or enhance coupling). In this context, the joining material is nucleated via deposition from a vapor phase or solution, with the joining material in the vapor or solution nucleating at the junction. The joining material may, for example, be used to increase the effective contact area between the nanostructures and/or increase conductivity between the nanostructures (reduce resistance/increase electrical and/or thermal conductivity), and be further used to strengthen the connection between the nanostructures. The joined nanostructures are used in one or more of a variety of applications, such as to form nanomaterial films, support structures and/or nanomaterial electronic circuits, such as transparent electrodes. In addition, where relatively large films (e.g., large area films including many structures) are joined, nanostructures across the entire film may be joined simultaneously using a common deposition process, with selectivity to the junctions between the nanostructures. Once junction sites are occupied, additional deposited material nucleates along the nanostructure, and can further dope the nanostructure. In certain more detailed embodiments, the carbon nanotubes (CNTs) and nanoglue or nanodopant material are in one solution, and mixing occurs there. This final mixed/combined solution is then deposited with the nanoglue and/or nanodopant at the junctions and on the CNTs.

In many applications, the Fermi level of the deposited joining material is less than the Fermi level of one or more of the nanostructures. This Fermi level can be set based upon the type of material deposited, thickness, and/or the conditions applied to the material. In some applications, the Fermi level of the deposited material is set by heating and/or light exposure. By controlling the Fermi level in this manner, electrical conductivity (and related thermal conductivity) can be desirably set for the joining material portion of the resulting structure. For various embodiments, the conductivity of the deposited material is particularly controlled to limit the resulting on-current of a device using the nanostructures (e.g., for joining material including molecular $C_{70}$ glue), where the thickness of the material can be set to ensure the film does not become too conductive in the off state, to maintain a high on/off ratio and transistor behavior (and no longer exhibits transistor behavior). The additive material increases the "on current."

In accordance with other example embodiments, nanostructures are joined to form a nanomaterial film. A molecular (e.g., non-alloy) joining material is deposited at junctions between a plurality of nano structures, and the deposited joining material is nucleated (e.g., the joining material nucleates at the junctions upon deposition). The nucleated joining material forms conductive material at each of several junctions between nanostructures, to physically and conductively (electrically and/or thermally) couple the nanostructures together and form the nanomaterial film. In many implementations, the Fermi level of the joining material used across the film is less than the Fermi level of a majority of or substantially all of the nanostructures (e.g., more than 75%, more than 85%, or more than 95% of the nanostructures). Where a mixture of nanostructures (e.g., in terms of one or both of diameter and band gap) is present in the film (e.g., semiconducting, semi-metallic, and metallic nanostructures and/or nanowires), the Fermi level of the joining material used in the film is less than a majority of or substantially all of one type of the nanostructures (e.g., the semiconducting nanostructures).

The nanostructures are doped using dopant material in the joining material, to reduce a resistance value of the nanostructures (e.g., relative to a resistance value of the nanostructures, prior to doping the nanostructures). In some applications, this approach is carried out with a network of nanotubes including semiconducting nanotubes, and the semiconducting nanotubes are doped to increase their conductivity (e.g., to convert the nanotubes from semiconducting to conducting metallic-based nanotubes, and to increase one or both of thermal and electrical conductivity). The resulting resistance value can thus be substantially less (e.g., half of, or one or more orders of magnitude less) than the resistance value, prior to the deposition and nucleation of the joining material. In many implementations, the uniformity of the electrical conductivity across the film is set by converting most or all of the nanostructures to nearly the same energy levels, and by reducing or eliminating pockets of differing ratios of different types of nanostructures (e.g., semiconducting, semi-metallic, metallic) in the film.

Another example embodiment is directed to joining nanostructures, such as carbon-based nanostructures or metallic nanowires (e.g., one or more of gold, silver or copper), with a charge transport material to form a nanomaterial film. A joining material is deposited or otherwise placed at junctions between nanostructures. The deposited joining material is then nucleated to form (and/or enhance) charge transport structures at each of the junctions. The charge transport structures physically, thermally and electrically couple the nanostructures. The resulting combination of the nanostructures joined via the joining material forms the aforesaid nanomaterial film (e.g., an organic film).

In some implementations, the transparency of the organic nanomaterial film is set using one or more of a density of the carbon-based nanostructures, the diameter of the nanostructures, the type of joining material, and the selectivity of the joining material to the nanostructures. In connection with these implementations and related embodiments, it has been discovered that joining materials can be selective to the nanostructures upon which they are deposited, relative to underlying substrate materials, which can be useful to preserve transparency. It has also been discovered that the density of nanostructures can affect the selectivity of deposited joining material to the nanostructures (e.g., as relevant to the deposition of the joining material on an underlying substrate). It has further been discovered that this selectivity can be used to set the transparency of a resulting film that is formed by the nanostructures. In this context, and in accordance with various example embodiments, the nanostructures are arranged on a substrate at a density that facilitates the selectivity of the joining material upon deposition, to mitigate the deposition of the joining material upon the substrate. The substrate temperature may be controlled at a desirable deposition temperature such as in the range of at or below room temperature up to about 250 degrees Celsius. The joining material is nucleated to join the nanostructures and form a conductive film having the set transparency (e.g., of at least about 70% passage of light, and up to and exceeding about 95% passage of light, depending upon the application).

In another implementation, the joining material is used to enhance conductivity of a free-standing structure composed of or comprising the nanostructures, such as a mat, wire or cable. In some instances in which the substrate itself is a nanostructure-based free-standing mat or wire or cable, conductivity is increased without necessarily regarding effects upon transparency.

In other implementations, the joining material is also used to enhance conductivity of the carbon-based nanostructures, such as via its extension along the nanostructures upon nucleation and/or the doping of the nanostructures via the nucleated joining material. In connection with these implementations and related embodiments, it has also been discovered that the joining material can be nucleated at junctions to form along the nano structures, and the degree of coverage of the nanostructures can be set by the amount mixed with the nanostructures, and the amount and/or rate of joining material that is deposited on the nanostructures. In this context and in connection with various example embodiments, a quantity of joining material is selected in accordance with a desired resulting conductivity of the film, using historical data, charts, lookup tables or other approaches. This selected quantity is also based upon properties of the joining material (e.g., it has been further discovered that molecular joining material such as fullerene-based materials or derivatized fullerenes (e.g., $C_{60}$, $C_{70}$, $C_{84}$, $C_{60}Cl_6$, $C_{60}Cl_{24}$, $C_{70}F_{54}$ $C_{60}F_{18}$, $C_{60}F_{24}$, $C_{60}F_{36}$, $C_{60}F_{44}$, $C_{60}F_{48}$ and $C_{70}F_{54}$) can be particularly useful to enhance conductivity, as discussed further herein). The selected quantity of joining material is then deposited or otherwise formed on the nanostructures and nucleated to enhance the conductivity of (and as appropriate, join) the nanostructures.

In some example embodiments, nanotubes are doped using one or more dopants selected from a class of halogenated fullerene derivatives and at least part of the molecular formula contains:

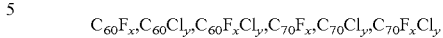

where X=1-55, for C60 and less than 65 for C70. More preferably, X=18, 24, 36, 48, 54 or 56. Where Y=1-55, for C60, and less than 65 for C70. More preferably, Y=4, 6, 24, 36, 48, 54, or 56. The nanostructure that is doped includes one or more of an individual nanotube, carbon fiber, nanowire, carbon nanotube or other nano/micro structure as described herein.

Other embodiments are directed to the joining of graphene-based structures, in which one to several thin layers of graphene is/are joined (and, where appropriate, doped) to suit a particular application or applications. For example, graphene layers can be joined and doped as desired to set their conductivity to a selected level for one or more of electronic, thermal, and high strength applications. In some implementations, graphene oxide or reduced graphene oxide is used in such applications, including those desirably involving certain processing characteristics that are achieved using graphene oxide. These approaches are amenable for improving electronic and thermal conductivities of such structures to create viable components in many applications and as suitable for various technologies.

In certain embodiments, and as consistent with the above discoveries, a nanomaterial film is formed having conductivity and transparency properties that are set relative to one another to achieve a film having desired properties for a particular application. For example, in certain applications, the addition of joining material to nanostructures can reduce the transparency of a film formed by the nanostructures, yet also enhance the conductivity of the nanostructures.

Accordingly, in connection with the above discoveries, levels of conductivity (electrical and/or thermal) and transparency are set with respective trade-offs relative to one another, to form a nanomaterial film that meets desired transparency and conductivity characteristics for a certain application. These characteristics and respective trade-offs are thus used to tailor nanomaterial films to various applications. These embodiments are thus applicable to the design and manufacture of nanomaterial films, and to the films themselves as having such a determined set of conductivity and transparency properties. Joined nanomaterials as described herein are thus tuned (in design) and manufactured for use in a variety of applications, such as flexible displays, touch screens, solar cells, electronic paper, heat generation, electrostatic discharge devices, batteries, supercapacitors, sensors, photochemical devices and electromagnetic shielding devices, ranging from relatively highly resistive to relatively highly conductive, with varying degrees of transparency as desirable for each application.

Also according to the present disclosure, a battery-directed or supercapacitor-directed embodiment includes at least one electrode formed by a film including a plurality of nanostructures on the substrate, and a nucleated joining material configured to physically and electrically couple the nanostructures at the junctions as described above. In certain applications thereof, the transmittance of light through the film is set based on testing and the needs for relative higher or lower levels of conductivity (electrical and/or thermal) and transparency. To this end and in a typical application of this type, a substantial majority of the joining material in the electronic circuit is physically and electrically coupled to the nanostructures (relative to the nucleated material not physically and electrically coupled) to set both the conductivity and the transmittance of light through the film. For example, the transmittance of light through the film-based electrode for collection of light-sourced energy in a solar-directed application would be greater than for a battery application. Accordingly, these levels of conductivity and transparency are set during the manufacturing processes as respective trade-offs relative to one another, as needed for the intended application and related design specifications.

In connection with other example embodiments, a hybrid material is formed when an additive material is placed on nanostructures (e.g., at junctions and upon sidewalls of carbon nanotubes). The hybrid material includes a material from the nanostructures and a dopant from a material deposited or otherwise formed on the nanostructures, such as from a joining material as discussed above or from a separately-deposited material such as a fullerene-based material that is applied to the nanostructure and nucleated (e.g., bromo, chloro, alkylfluoro and fluoro derivatized fullerene). The resulting arrangement of nanostructures and hybrid material exhibits reduced resistance, relative to the resistance of the nanostructures prior to the formation of the hybrid material. This approach may, for example, be used in connection with one or more embodiments as discussed above, and as appropriate, in connection with the above discoveries relating to the enhanced conductivity of nanostructures, as well as to transparency and conductivity properties of resulting nanomaterial films.

In connection with another example embodiment, interconnected carbon nanotube networks of nodes and branches are glued (e.g., joined) together at the nodes, or junctions, by a fullerene or fullerene derivative (e.g., a halogenated fullerene such as a bromo, chloro, alkylfluoro and fluoro derivatized fullerene) type of nanoglue molecule to form a carbon hybrid material. In some implementations, the fullerene nanoglue is multifunctional: it works at the nodes to glue crossing nano tubes together and decrease (pre-glued) junction resistance by providing a larger conduction pathway, and also works along the tube to strongly p-dope the nanotubes. This p-doping increases overall conductivity of the nanotube network, and is achieved with desirably low (e.g., minimal) effect upon the transparency of the nanotube network. In some implementations, the nanoglue molecule further forces the carbon nanotubes that are joined to be closer together. In addition, the nanoglue formation can be effected at the various carbon nanotube junctions, generally independently from the chirality of the carbon nanotubes. In connection with these approaches, sheet resistance values of less than about 1000 Ohms, and as low as or lower than 60 Ohms in some instances, with transparencies higher than about 80% (e.g., at wavelengths of about 550 nm), or, for many cases, with transparencies higher than about 92%, are obtained to suit one or more applications. For example, in touch screen applications, sheet resistance values of about 80% transparency can be used. For many applications, the sheet resistance is referred to as Ohms/sq or Ohms/square, which is a dimensionless measure generally equivalent to the measure of Ohms Such sheet resistance may be obtained, for example, using a joining material having a Fermi level that is less than a majority of or substantially all of the nanotube networks (e.g., as discussed above).

In addition to the above p-doping approach, various embodiments are directed to n-doping the nanotubes, using an n-type material to dope a nanostructure in a manner similar to that as discussed above with fullerene. When implemented in this manner, the Fermi level of the deposited joining material may be set above that of one or more of the nanostructures being joined. This approach may be used to set the conductivity and, for application in an environment including (but not limited to) $N_2$, may increase the conductivity of the nanostructure(s), as may be used in transistors and/or other semiconductor devices.

In certain embodiments, nanostructures such as CNTs, graphene, or nanowires are dispersed in a solution, such as a surfactant or polymer-based solution, and deposited from the solution. In these embodiments, surfactants or polymers may cover some of or the entire surface of the nanostructures, and joining and/or dopant material as described herein is deposited on the covered surface. The structures may be joined via the covered surface and/or exposed portions of the underlying nanostructures. Accordingly, charge transfer in such structures may be effected either through exposed regions of the CNT or graphene, or via charge transfer to the coating on the surface and further through the coating on the CNT or graphene. In some implementations, the nanostructure and joining/dopant material film or a freestanding structure is covered with a polymer layer, such as for encapsulation, planarization, or to alter the conductivity of the film or structure.

In various contexts, the term "circuit" as described herein applies to a conductor that forms part of a circuit, and/or to a circuit having a conductor, a power source and, where appropriate, one or more other components. For example, the term circuit may refer to a conductor or conductive sheet that can be powered and coupled to one or more circuit components. The term circuit may also refer to such a conductor or conductive sheet, along with one or more of a power source, additional circuit connectors, loads, storage devices, sensor circuitry and others.

The term nanostructures is also used, in many contexts, to refer to structures such as carbon nanotubes, metal nanowires, or graphene having diameters of between about 1 nanometer or several nanometers (e.g., with a nanotube representing a rolled graphene sheet), such as between about 1 nm and 10 nm, or between about 10 nm and 100 microns. Because a nanostructure can include a bundle of CNTs or metal wires, the term nanostructure can represent an overall diameter of 1 nm to 1 μm. Although wires/cables may be larger in diameter, they may include individual nanostructures on such a size (diameter) order. The length of these nanostructures can be set to about 100 nm long up to several cm long to suit different applications. Such structures can be joined, via nucleation (and crystallization and/or condensation) of a joining material at junctions between nanostructures, using surface energy characteristics of the junctions to facilitate the nucleation.

The term nucleated is used, in various contexts, to refer to the nucleation of crystalline growth at a particular (nucleation) site, from which the crystalline growth continues (or amorphous as the growth is not necessarily crystalline). In many embodiments, this nucleation is selective to locations at which nanostructures touch or are very close to touching, in which the surface energy facilitates the nucleation (e.g., high energy sites that are selective for nucleation may include junctions and defect sites along the nanostructure). Joining material that is nucleated (nucleates) at junctions between nanostructures thus effectively joins the nanostructures via crystallization and/or condensation, which can be effected without chemical bonding. This nucleation can further be carried out at relatively low temperatures, such as below about 300 degrees Celsius at the nucleation site, and can further be effected using a single step (e.g., upon nucleation, no further steps are needed to facilitate the connection of the nanostructures).

The term "molecular joining material" is used to refer to a non-alloy type of material, or to a material that does not chemically bond with nanostructures electrically and/or physically connected via the joining material. Accordingly, in many implementations, this molecular joining material is a material that does not chemically bond with the nanostructures during deposition and/or growth of the material, and does not include a material that initially bonds with the nanostructures and is subsequently removed. Materials falling under the scope of "molecular joining material" include a fullerene material as discussed above, such as $C_{60}$, $C_{70}$, and $C_{84}$, as well as other higher (larger) and lower (smaller) fullerenes, or substituted fullerenes (e.g., with halogen substitution, such as with Fluorine, Bromine, Iodine, or Chlorine substitution). In some implementations, the molecular joining material includes p-type organic molecules such as Pentacene or copper phthalocyanine, and/or n-type organic molecules such as naphthalenetetracarboxylic diimide (NTCDI) and Tetrafluoro-tetracyanoquinodimethane ($F_4$TCNQ). In still other implementations, the joining material includes a metal nanoparticle such as a material including one or more of Gold, Silver, Palladium, Titanium, Copper, Aluminum and Platinum. In other implementations, the joining material includes an insulating material, such as an inorganic oxide ($Al_2O_3$ or $SiO_2$) or a polymer (polystyrene, poly(methyl mathacrylate), poly(vinyl phenol), or a conducting polymer polythiophene, polyaniline, PEDOT, or polypyrrole. Accordingly, fullerene-based, small organic molecule-based, polymer-based and metal nanoparticle-based molecular joining materials may be used to suit different applications. Other materials falling under the scope of a "molecular joining material" include other conjugated polymers, and graphene.

Correspondingly, materials that would not fall under the scope of a "molecular joining material" include, for example, materials that chemically bond with the nanostructures, or a conductive entity (e.g., metal) coupled with another molecule that bonds to the nanostructures. Examples of such materials include a metal-amino acid material, such as gold-cysteine, in which the amino acid bonds with the nanostructures, and where further processing may remove the amino acid and leave the metal behind. Other materials not falling under the scope of a "molecular joining material" include any other material joined in a process above 400° C.

The Appendix filed as part of the underlying Provisional Patent Application to which this application claims benefit describes various other example embodiments, including more detailed/experimental-type embodiments. The embodiments in the Appendix (and the underlying Provisional Patent Application as a whole) may be implemented in connection with one or more of the above-described embodiments and implementations, as well as with those shown in the figures and described below. For example, the various experimental-type diagrams showing performance-type characteristics may be implemented with a nanostructure device manufactured in accordance with and/or exhibiting characteristics as described herein.

Turning now to the figures, FIG. 1 shows a nanostructure arrangement 100 at various stages of a joining process, according to another example embodiment of the present invention. Here, nanotubes 110 and 120 at A are shown by way of example, yet the approach shown and described as follows can be used in connection with a variety of nanostructures (or microstructures, as discussed above). For example, one or more of CNTs, single-walled nanotubes (SWNTs), double-walled nanotubes (DWNTs), multi-walled carbon nanotubes (MWCNTs), carbon fibers, nanomaterial tows, graphene, inorganic and/or organic nanowire, and nanomaterial ropes (e.g., bundles of ranging diameter) can be joined as shown. Different types of nanomaterials may also be used, such as nanotubes with varying chirality, semiconducting nanotubes, metallic nanotubes, inorganic and organic nanowire (e.g., with one or more of ZnO, Ag, Au or Si), or a combination thereof. In addition, while two nanotubes 110 and 120 are shown, a multitude of such nanostructures can be joined together, as different types of nanostructures (e.g., SWNTs and MWNTs) may be as well. The resulting structure may be used to form a variety of devices such as a conductive wire, circuit and/or an entire film of these nanostructures. The density, alignment, length, and overall thickness (e.g., ranging from 1-100 nm or much higher) of the nanostructures 110 and 120 is also set to suit particular applications. In addition, the nanostructures 110 and 120 can be free standing, or formed upon a substrate.

A molecular joining material is deposited on the nanostructures 110 and 120 at B, such as from solution or from vacuum, and the deposited joining material is nucleated as shown at C to form a nucleated joining material 130 that physically, thermally and electrically couples the nanostructures 110 and 120 at junctions between the nanostructures, which can be used to enhance both the conductivity and strength of the coupled nanostructures. Generally, the joining material 130 glues, welds or otherwise couples the nanostructures, which may be in contact with one another or separated (e.g., by a few nanometers), prior to the nucleation of the joining material. The deposition and nucleation of the joining material can be carried out across the nanostructures as shown (e.g., with growth along the structures from a junction nucleation site), but also across an entire film of such nanostructures, to form an interconnected network that renders the film conductive.

In some embodiments, a dopant material 140 is deposited upon and dopes the nanostructures 110 and 120 as shown at D. In some implementations, the dopant material 140 is the same material as the joining material 130, and is deposited concurrently with the joining material. In such implementations, the dopant material 140 may be deposited at the junction and grown along the nanostructures 110 and 120. The dopant material 140 may also be deposited directly upon the nanomaterials 110 and 120, away from the junction (e.g., along sidewalls of nanotubes). In other implementations, the dopant material 140 is deposited in a step that is separate from, or at least partially separate from, the deposition of the joining material 130, and may include a material that is the same as and/or different from the joining material. The dopant material 140 can effect a permanent doping, increase the conductivity of the nanostructures 110 and 120, and is stable over time.

In some embodiments, the joining material 130 is first deposited, followed by the dopant material 140, where the joining material has a Fermi level that is lower than one of the nanostructures and the dopant material has a Fermi level that is lower than the joining material. The joining material can be used to nucleate the dopant material (e.g., to facilitate a nucleation site from which the dopant material grows (as may be applicable to the embodiment).

In some instances, the dopant material 140 is selective to the nanostructures 110 and 120, relative to surrounding materials. For example, when the nanostructures 110 and 120 are formed on a substrate, the dopant material 140 adheres to the nanostructures more selectively than to the underlying substrate, thus facilitating desirable levels of transparency. The thickness of the dopant material 140 may be set in accordance with the desired level of transparency as well, and/or may be set in accordance with a desired resulting conductivity of the nanomaterials.

Figure 2A:
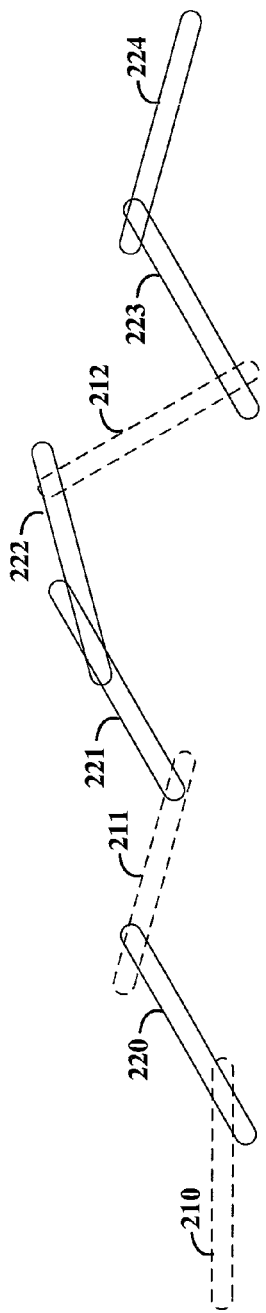
Figure 2B:
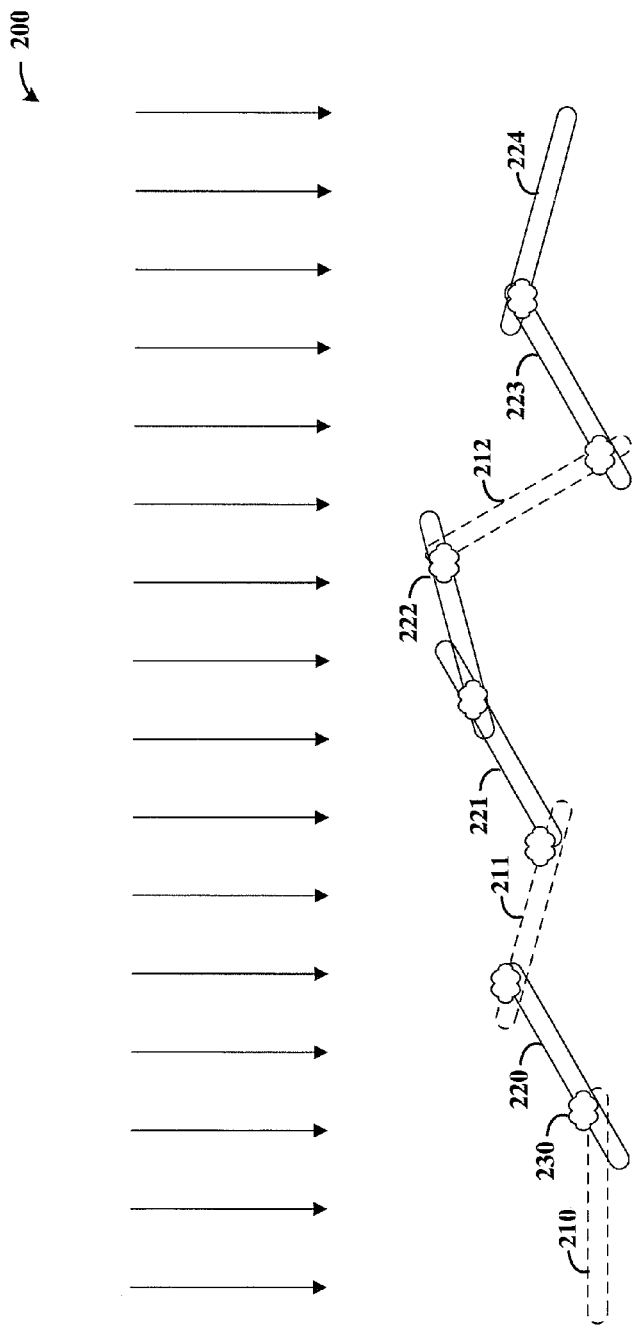
Figure 2C:
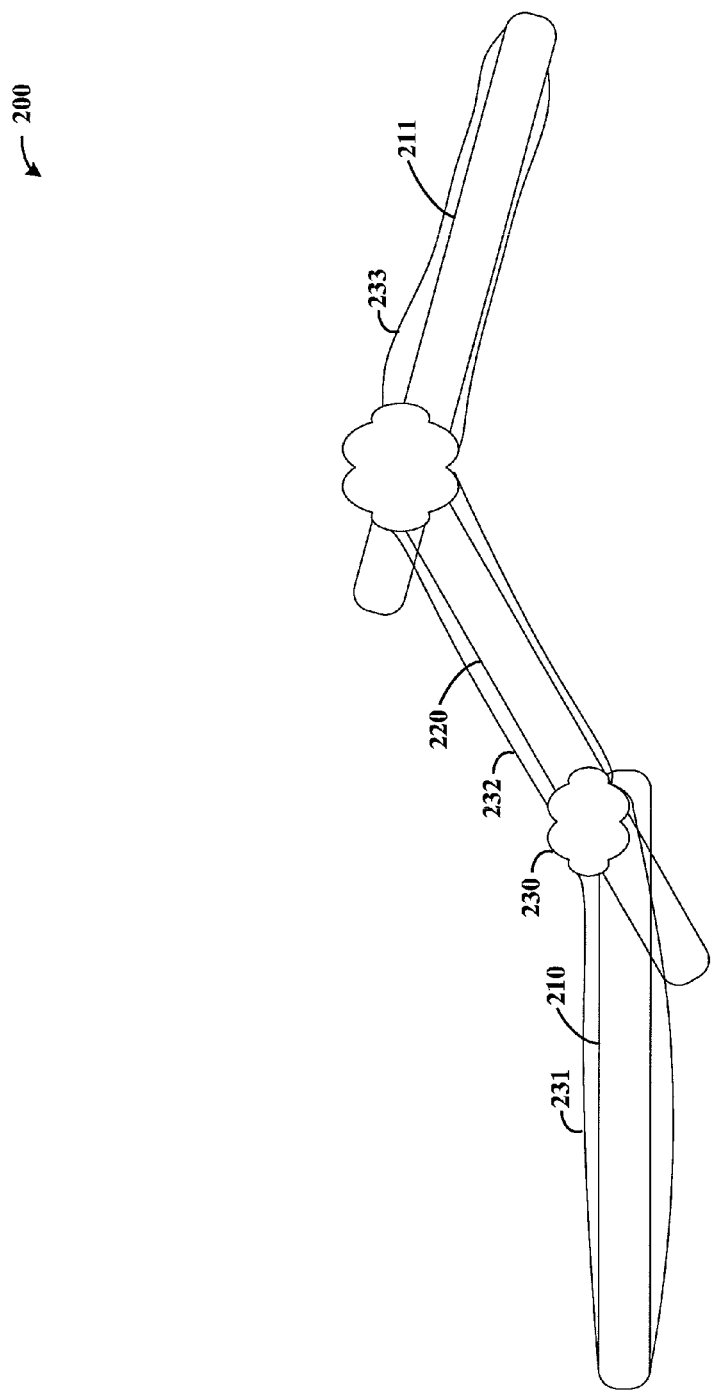

FIGS. 2A-2C show nanostructures at various stages of manufacture, in accordance with one or more example embodiments. In FIG. 2A, semiconducting and metallic nanotubes are arranged for joining, with semiconducting nanotubes 210, 211 and 212 shown in dashed lines, and metallic nanotubes 220, 221, 222, 223 and 224 shown in solid lines. While semiconducting and metallic nanotubes are discussed and shown here, various ones of the nanotubes can be semi-metallic and/or exhibit various different ban gaps with semiconducting and/or metallic characteristics. In FIG. 2B, a joining material has been deposited at junctions between the nanotubes, with joining material 230 shown by way of example. FIG. 2C shows an enlarged view of nanotubes 210, 220 and 211, with the joining material having been nucleated with portions 231, 232 and 233 extending along at least a portion of the respective nanotubes. In addition, nanotubes 210 and 211 have been doped with the joining material, and are now metallic nanotubes as represented by solid lines. In various embodiments, the nucleated material 231, 232 and 233 is deposited along the nanotubes (for the intermediate device shown in FIG. 2B), and nucleated as shown, in addition to and/or as an alternative to the nucleation of the joining material 230 for extending along the nanotubes.

Figure 3:
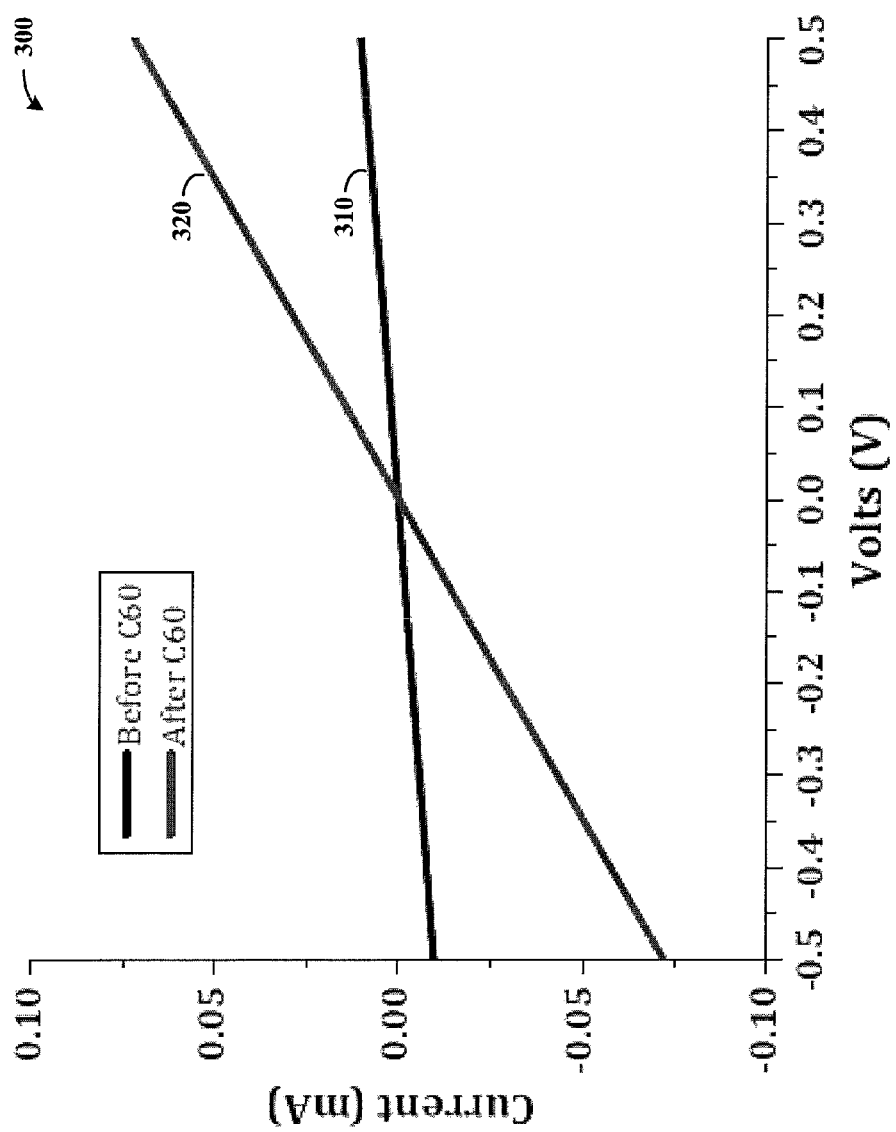
FIG. 3 is a graph showing plots of current/voltage characteristics of a nanostructure joined using $C_{60}$, in accordance with other example embodiments.

FIG. 3 shows a graph 300 having plots showing current/voltage characteristics of a nanostructure joined using $C_{60}$, in accordance with other example embodiments. By way of example, plot 310 represents current/voltage characteristics of a nanotube network having nanotubes arranged in contact, or close contact, with one another prior to joining (e.g., as shown in FIG. 2A). Plot 320 represents current/voltage characteristics of a nanotube network with nanotubes joined using $C_{60}$, such as shown in FIG. 2B. Other embodiments involve joining nanostructures using $C_{70}$ or higher fullerenes such as $C_{84}$.

Figure 4:
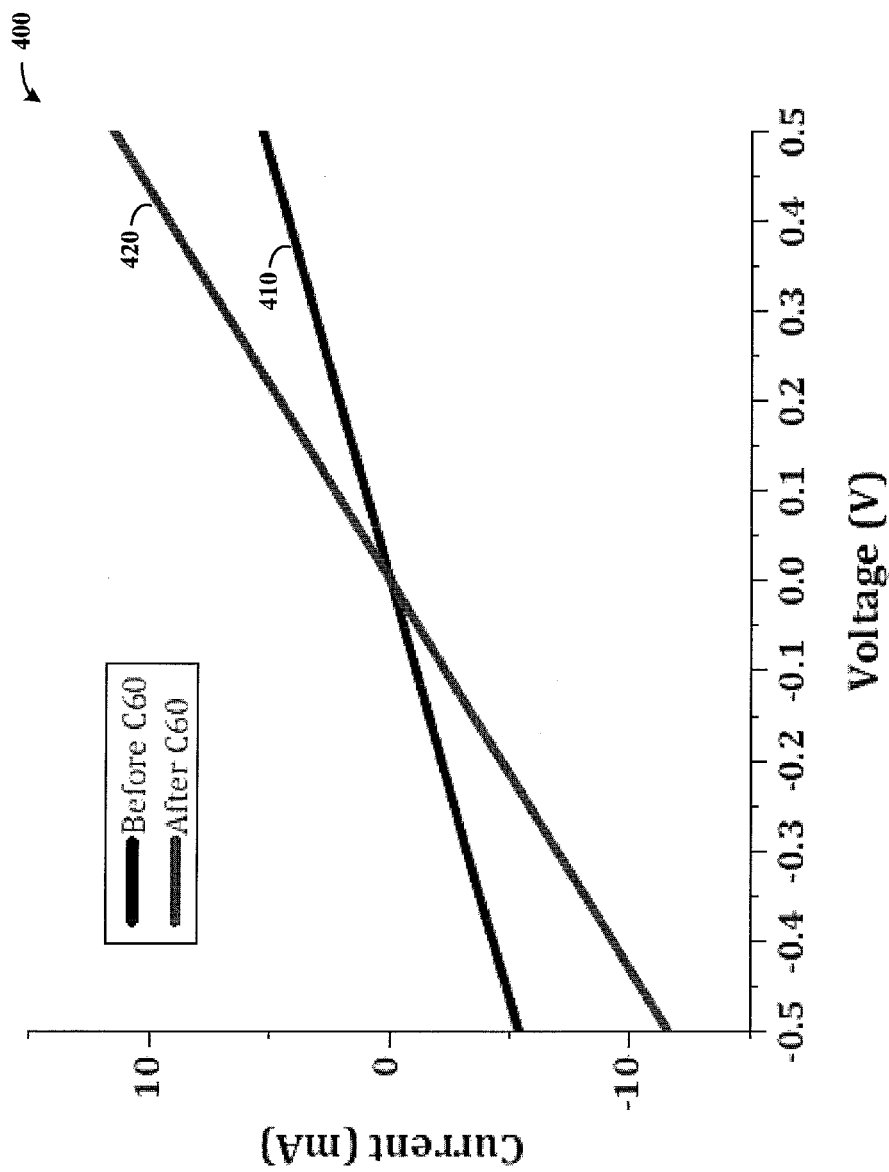
FIG. 4 is a graph showing plots of current/voltage characteristics of a high-density nanostructure joined using $C_{60}$, in accordance with other example embodiments.

FIG. 4 is a graph 400 showing plots of current/voltage characteristics of a high-density nanostructure joined using $C_{60}$, in accordance with other example embodiments. The represented nanostructure has a higher density of nanotubes, relative to that represented in FIG. 3. By way of example, plot 410 represents current/voltage characteristics of a nanotube network having nanotubes arranged in contact, or close contact, with one another prior to joining (e.g., as shown in FIG. 2A). Plot 420 represents current/voltage characteristics of a nanotube network with nanotubes joined using $C_{60}$, such as shown in FIG. 2B.

Figure 5:
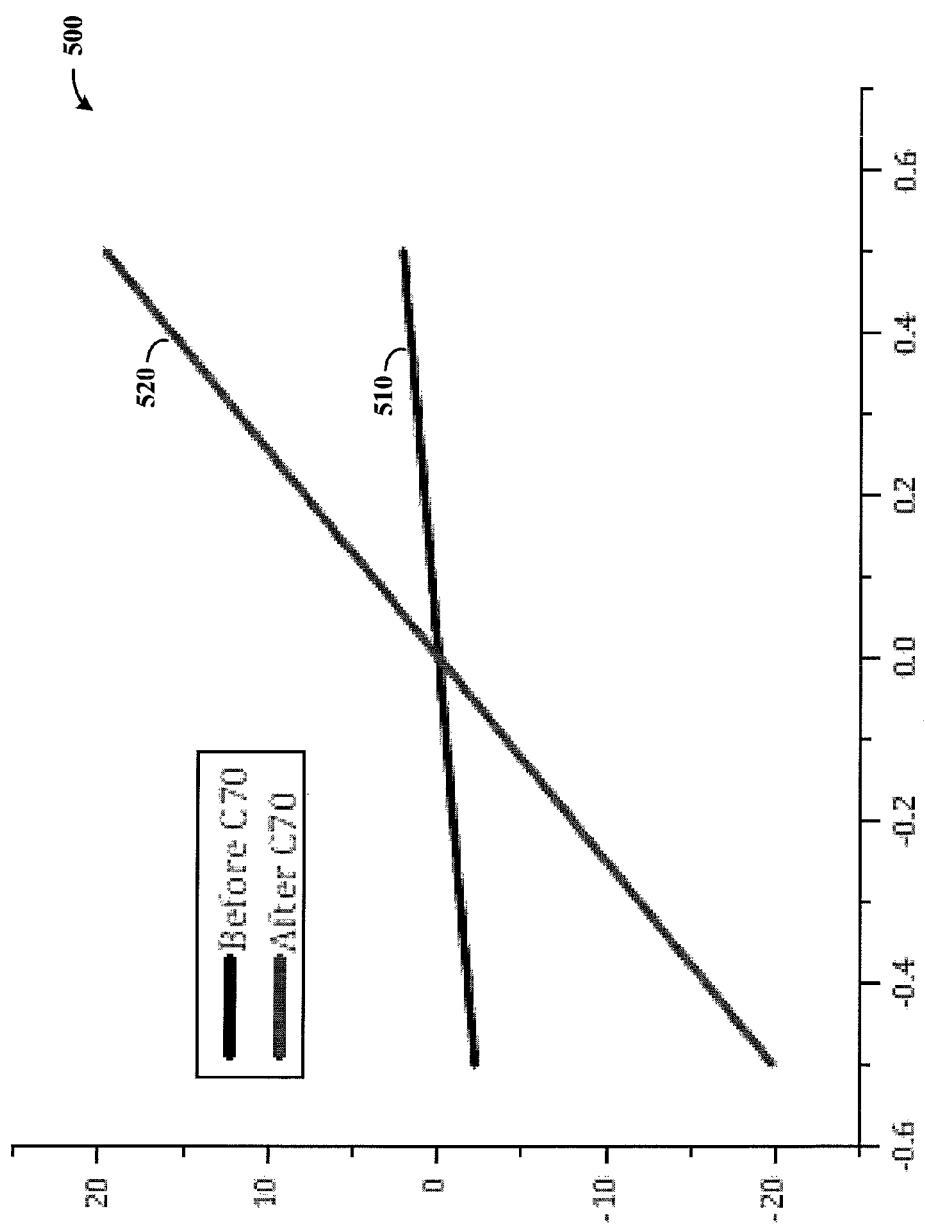
FIG. 5 is a graph showing plots of current/voltage characteristics of a nanostructure joined using $C_{70}$, in accordance with other example embodiments.

FIG. 5 is a graph 500 showing plots of current/voltage characteristics of a nanostructure joined using $C_{70}$, in accordance with other example embodiments. By way of example, plot 510 represents current/voltage characteristics of a nanotube network having nanotubes arranged in contact, or close contact, with one another prior to joining (e.g., as shown in FIG. 2A). Plot 520 represents current/voltage characteristics of a nanotube network with nanotubes joined using $C_{70}$, such as shown in FIG. 2B.

The following discussion may be implemented in connection with one or more of the above-discussed figures and/or example embodiments. As used in connection with various example embodiments herein (above and as follows), the term "nanostructure" may refer to structures having dimensional characteristics on a nanometer scale, such as carbon nanotubes often having a diameter in the range of about one nanometer (and lengths that may well exceed thousands of nanometers). In other embodiments, the term "nanostructure" refers to structures having dimensional characteristics on the scale of hundreds of nanometers, nearing (and perhaps exceeding) one micrometer, such as carbon fibers having diameters ranging from several hundred nanometers to several micrometers. The term "nanostructure" may also refer to double-walled nanotubes (DWNT) and multi-walled nanotubes (MWNT) with three or more walls, in various embodiments.

In some implementations, a hybrid structure includes a CNT network joined with fullerene material that has been selectively grown at CNT-CNT junctions. The fullerene (e.g., nanoglue) reduces the contact resistance of the CNT-CNT junctions, leading to highly conductive films, and further leading to high-strength structures as the CNT network is strengthened via the joining material. In some implementations, a relatively thick fullerene film is deposited on CNTs to grow along the CNTs with relatively low molecular orbital energies, with respect to molecular orbital energies of the CNTs, to p-dope semiconducting, semi-metallic, and other various band-gap CNTs, and form metallic CNTs or a metallic carbon hybrid film.

In some embodiments, a joining material including $C_{60}$ is deposited on an array of carbon nanotubes (CNTs) to form a continuous or nearly continuous structure (or sheath) along the nanotubes, creating a $C_{60}$ nanowire type of structure that is templated by underlying CNTs. In some applications, the fullerene nucleates at junction sites between CNTs, and then grows along the CNTs. In one example, a fullerene material is deposited to a thickness of about 1-3 nanometers to form small particles on the CNTs, with a higher occurrence of these particles at junctions between the CNTs. The thickness of deposited fullerene can be set to suit various applications. In connection with these approaches, it has been discovered that increasing the thickness of deposited fullerene can be carried out to effect a high increase in the length of fullerene particles, relative to increases in width. Fullerene deposition beyond 5 nanometers effects coverage of the underlying CNT-template and the height undergoes a more dramatic increase. Accordingly, the thickness of deposited fullerene (or other joining material) can be set to control the resulting structural characteristics.

In some embodiments, a fullerene-based material including $C_{70}$ (as discussed above) is used to join nanotubes. In connection with these embodiments, it has also been discovered that $C_{70}$ exhibits more complete growth on nanotubes relative to $C_{60}$, and can be used to form an essentially continuous nanowire via the deposition of a $C_{70}$ layer of about 5 nanometers in thickness.

Figure 6:
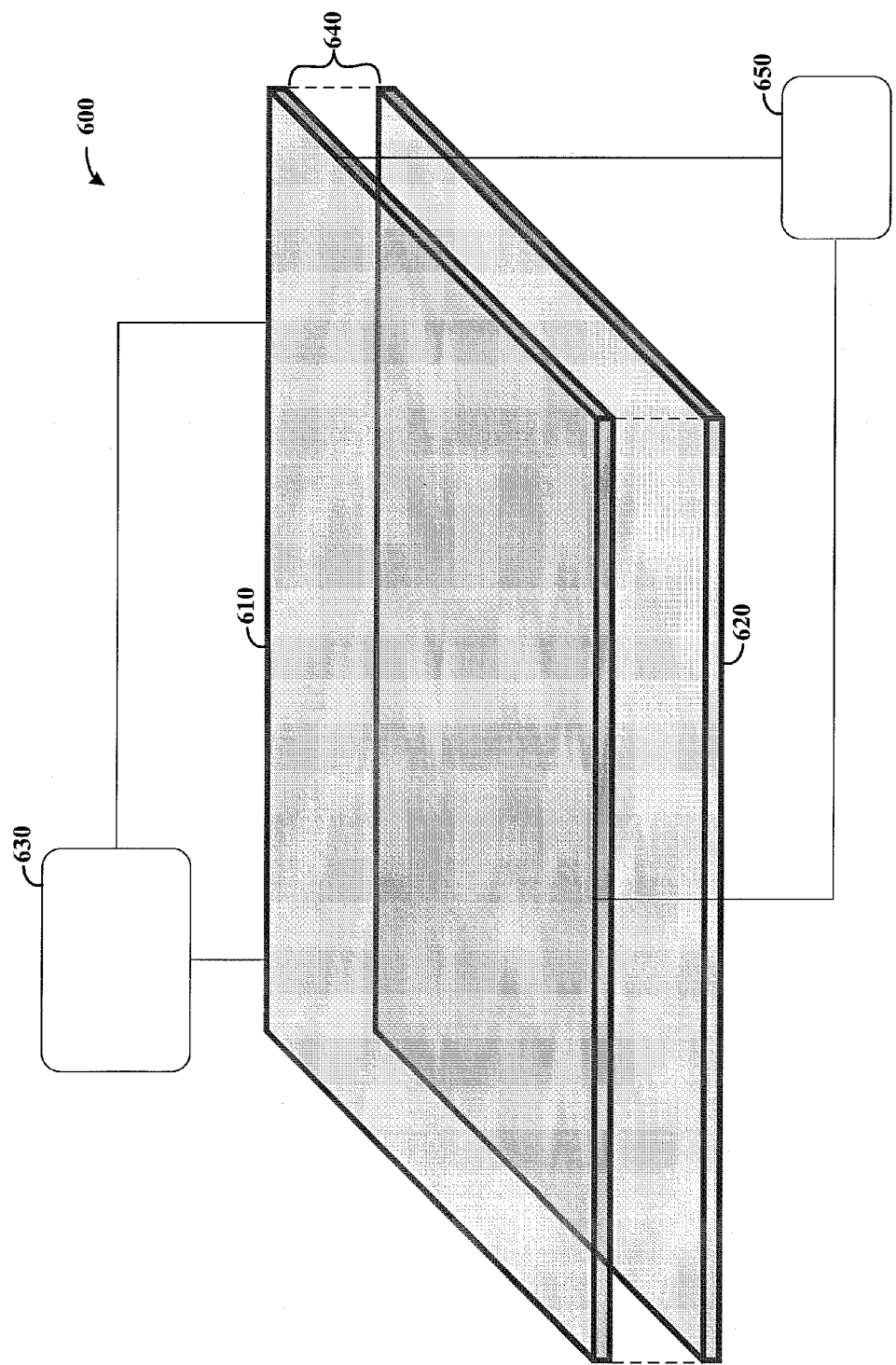
FIG. 6 shows carbon nanotube films having joined carbon nanotubes, for devices in accordance with various example embodiments of the present invention.

As discussed above, the nanostructures as described herein are applicable for use in one or more of a variety of circuits and devices. FIG. 6 shows one such arrangement of nanostructures 600 as applicable to a variety of devices, in accordance with various example embodiments of the present invention. Carbon nanotube films 610 and 620 are arranged generally parallel to one another, and include a multitude of joined carbon nanotubes, such as those shown in FIG. 2C above.

In another implementation, joining material is combined with one or more nanostructures in solution, and the solution is then used to form the hybrid network in a single step. For instance, a solution of nanostructures and joining material may be deposited or coated upon a substrate, and the joining material is used to join the nanostructures in a manner as described herein, by initiating at junctions (e.g., due to interactions) and extending from such junctions as may be controlled via an amount of the joining material in the solution.

In some implementations, the carbon nanotube film layer 610 is used independently from the film layer 620 as a flexible, transparent conductive coating upon a surface such as glass or plastic. The carbon nanotube film 610 is optionally coupled to other electronic circuit components, such as a power source 630. In some implementations, the carbon nanotube film 610 is coated onto a glass surface and used to heat the surface, such as for defrosting transportation glass (e.g., windows in automobiles, airplanes, trains or helmets).

Other implementations are directed to using both films 610 and 620 to form a touch screen device, with a spacer layer 640 between the films. When pressure is applied to film 610, a change in capacitance, or resistance, in the film is detected via circuitry 650, which is selectively coupled to one or both films 610 and 620. The circuitry 650 may, for example, be coupled in a grid-type arrangement to one or both of the films, and configured to sense changes in capacitance, or resistance, at a portion of the grid and therein detect the location of applied pressure.

In another example embodiment, the nanostructure arrangement 600 includes electrochromic circuitry for windows and/or displays. In this embodiment, the spacer layer 640 is a three-layer structure including an electrochromic material on the film 620, an ion-conductor on the electrochromic material, and a counter electrode upon the ion-conductor. The film 610 is located on the counter electrode, and the resulting structure 600 can be placed, for example, between panes of window glass or below a reading surface for displays. For instance, power source 630 may apply a small voltage to the structure 600 to cause it to darken windows, and apply a reverse voltage to lighten the windows, for controlling the passage of light and other radiation including heat.

Figure 7:
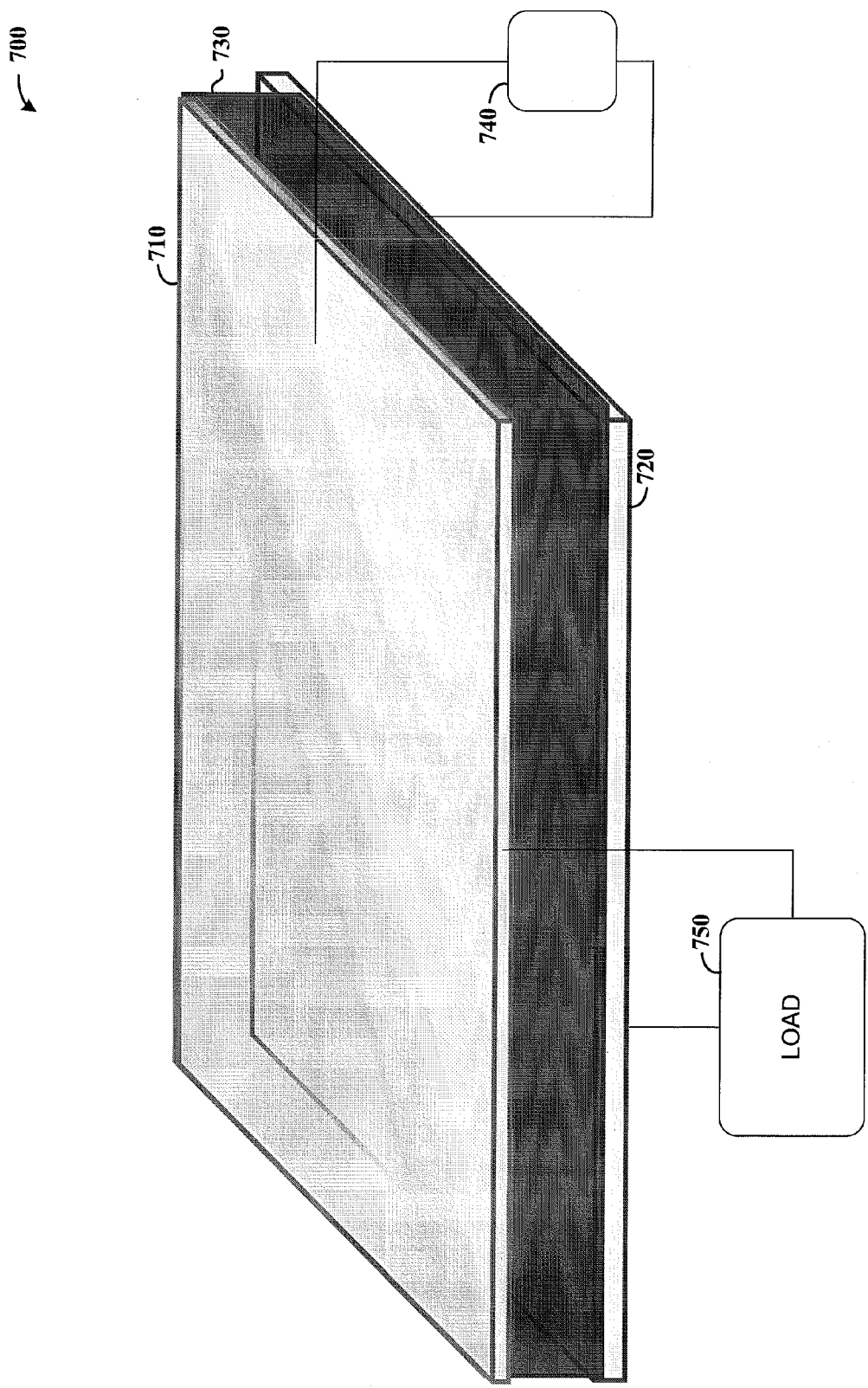
FIG. 7 shows an electronic device having a carbon nanotube film on an underlying substrate with a back electrode, in accordance with other example embodiments of the present invention.

FIG. 7 shows an electronic device 700 having a hybrid carbon nanotube film 710 on an underlying substrate 720 and a back electrode 730, in accordance with other example embodiments of the present invention. The hybrid carbon nanotube film 710 includes carbon nanotubes joined as described above and, in some implementations, further altered in conductivity via doping or other growth of joining (or other conductive) material along the nanotubes as shown in FIG. 2C.

The density and/or construction of the carbon nanotubes used to create the hybrid carbon nanotube film 710 vary according to the application. In one application, the length of the joining material along the carbon nanotubes is set via nucleation (condensation and/or crystallization since when it nucleates being amorphous is not necessary), to set the conductivity of the nanotubes in accordance with the length of the nanotubes, separation or density, to suit various types of nanotube films. For such applications, the average length of the carbon nanotubes can be optimized to increase the surface area at which the material along the carbon nanotubes is joined. For example, the average length of the carbon nanotubes can be manufactured by a variety of processes including, e.g., vapor-liquid-solid (VLS) growth, arc-discharge, CVD, high-pressure CO conversion (HiPCO), and laser-ablation. Using such processes, the average diameter and average length of the carbon nanotubes can be set and, therefrom, the density of the carbon nanotubes can be set as a function of such diameter and length. As a non-limiting example for the film 710 with thickness set as a function of the desired transparency, these parameters are: average diameter between 1-50 nm and average length between 100 nm-100 μm, with certain carbon nanotubes grown up to about 20 cm, and a density of between about 10 and 1000 μm$^2$. For general information regarding nanotube synthesis, and for specific information regarding approaches to synthesizing nanotubes that may be used in connection with one or more example embodiments, reference may be made to Chin Li Cheung, Andrea Kurtz, Hongkun Park, and Charles M Lieber, "Diameter-Controlled Synthesis of Carbon Nanotubes," *J. Phys. Chem. B,* 106 (10), pp 2429-2433 (2002), which is fully incorporated herein by reference.

In one embodiment, the device 700 is used as part of an electronic display or electronic paper, with the film 710 located (e.g., coated) on a glass or plastic surface 720. A power source 740 applies an electric field between the back electrode 730 and film 710 (top electrode) for a variety of applications. In one implementation, the power source 740 applies an electric field to activate charged inks for an electronic paper device. In another implementation, the power source 740 applies an electric field to inject carriers into light-emitting diodes (LEDs) for LED displays. In still other implementations, the power source 740 applies an electric field to switch liquid crystal molecules for LCD displays.

In another example embodiment, the device 700 is a solar cell circuit, with the back electrode 730 including a reflective material such as Aluminum and the underlying substrate 720 including a semiconducting active layer. The hybrid carbon nanotube film 710, acts as a transparent electrode that allows light to pass through to the semiconducting active layer 720 to generate excited carriers. One carrier type (electron or hole) is then transported via the top transparent electrode 710 and the other carrier is collected by the bottom electrode 730. A circuit is completed by a load circuit 750, which may actively use power generated by the circuit and/or store the power. The semiconducting active layer 720 includes one or both of organic and inorganic materials. In another implementation, the hybrid carbon nanotube film 710 can act as an additional charge collector in between busbars and fingers on silicon-based solar cells. The hybrid film 710 can also be used in conjunction/combination with other transparent electrode materials (such as ITO, FTO, AZO) for work function compatibility and other stability layers. In certain embodiments, the back electrode 730 is also a joined carbon nanotube film as discussed herein, tuned to effect desirable solar cell properties (e.g., via controlled joining, functionalization or other workfunction-type of modification).

Figure 8:
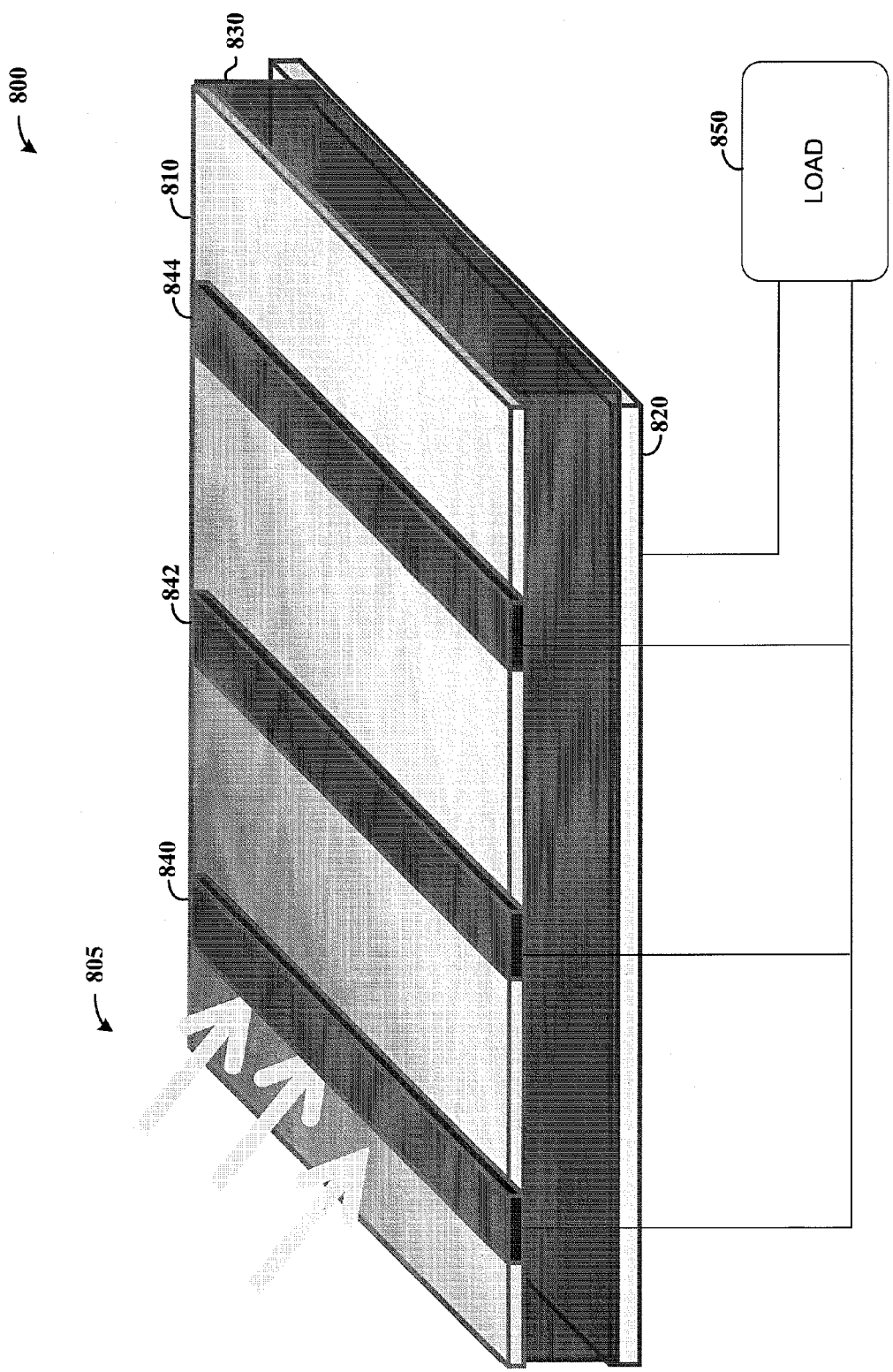
FIG. 8 shows a solar cell, in accordance with another example embodiment of the present invention.

FIG. 8 shows a solar cell device 800, in accordance with another example embodiment of the present invention. The device 800 includes a hybrid carbon nanotube film 810 on an underlying active layer 820 and back electrode 830, similar to the device 700 shown in FIG. 7 with the hybrid carbon nanotube film 810 including _carbon nanotubes joined as described above and, in some implementations, further altered in conductivity via doping or other growth of joining (or other conductive) material along the nanotubes as shown. The device 800 also includes several bus-bars 840, 842 and 844, used to extract charge carriers generated in response to light applied to the active layer 820. The film 810 facilitates charge collection between the silver bus-bars 840-844. As with the above discussion in FIG. 7, the back electrode 830 includes a reflective material such as Aluminum. The active layer 820 includes a semiconducting type material, such as high purity crystalline silicon.

When light (represented by arrows at 805) impinges upon the film 810, the film passes the light to the underlying active layer 820 in which carriers are generated and collected by the silver bus-bars 840-844, with the film 810 facilitating carrier collection by the silver bus-bars. A load 850, such as an electric device, a storage device (e.g., a battery), or a combination of an active circuit and storage device is connected in a circuit between the sliver bus-bars 840-844 and the back electrode 830. The load 850 is accordingly powered by current flowing in the circuit as generated in the active layer 820.

Various embodiments described above, in the underlying Provisional Patent Application (including the Appendix that forms part thereof) and shown in the figures may be implemented together and/or in other manners. One or more of the items depicted in the drawings/figures herein and/or in the underlying Provisional Patent Application can also be implemented in a more separated or integrated manner, or removed and/or rendered as inoperable in certain cases, as is useful in accordance with particular applications. For example, various embodiments directed to nanostructures may be implemented with microstructures, such as those having diameters or other dimensional characteristics on the order of about 1 nanometer to hundreds of nanometers. Similarly, embodiments characterized using carbon-based structures may be implemented with non-carbon-based structures (e.g., nanotubes of other materials or of hybrid carbon materials). In view of the description herein, those skilled in the art will recognize that many changes may be made thereto without departing from the spirit and scope of the present invention.

What is claimed is:

1. A method for joining nanostructures, the method comprising: depositing a non-alloy molecular joining material between nanostructures; and nucleating the joining material to form a nucleated material between the nanostructures that effects a charge transfer to the nanostructures and forms a hybrid material that physically and electrically couples the nanostructures together in a nanostructure film.

2. The method of claim 1, wherein nucleating the joining material includes crystallizing or condensation of the nucleated material from a nucleation site between the nanostructures, to physically couple the nanostructures together without chemically bonding the joining material with the nanostructures.

3. The method of claim 1, wherein depositing a molecular joining material includes depositing a non-polymeric molecular joining material having a Fermi level that is below the Fermi level of the nanostructures.

4. The method of claim 1, wherein depositing a molecular joining material includes depositing a molecular joining material including metallic nanoparticles and having a Fermi level that is below the Fermi level of the nanostructures.

5. The method of claim 1, wherein depositing a molecular joining material includes depositing at least one of a fullerene based, small organic molecule based, polymer based, and metal nanoparticle based molecular joining material.

6. The method of claim 1, wherein nucleating the joining material includes nucleating a plurality of nanostructures to form a nanostructure.

7. The method claim 1, wherein nucleating the joining material to form a nucleated material between the nanostructures includes coupling the nanostructures to form at least one of a free standing entity, a free-standing mat, a free-standing wire and a free-standing cable.

8. The method of claim 1, wherein nucleating the joining material to form a nucleated material between the nanostructures includes forming a nucleated material between nanostructures including at least one of a single-walled carbon nanotube, double-walled nanotube, multi-walled carbon nanotube, carbon fiber, organic nanowire, inorganic nanowire, and graphene.

9. The method of claim 1, wherein depositing a molecular joining material between nanostructures includes depositing the molecular joining material from at least one of a solution and a vapor phase material.

10. The method of claim 1, wherein nucleating the joining material to form a nucleated material between the nanostructures includes nucleating the joining material at a temperature that is less than 300 degrees Celsius.

11. The method of claim 1, wherein depositing a molecular joining material includes depositing a molecular joining material having a Fermi level that is at least 0.026 eV below the Fermi level of at least one of the nanostructures.

12. The method of claim 1, wherein depositing a molecular joining material includes depositing a material having a conduction band that is at least 0.026 eV below the lowest energy level in the conduction band of at least one of the nanostructures.

13. The method of claim 1, wherein nucleating the joining material to form a nucleated material between the nanostructures includes forming a nanostructure sheet having a sheet resistance that is less than about 5,000 Ohms/square.

14. The method of claim 1, wherein nucleating the joining material to form a nucleated material between the nanostructures includes forming a nanostructure sheet that passes at least 40% of light incident upon the sheet.

15. The method of claim 1, wherein nucleating the joining material to form a nucleated material between the nanostructures includes forming a nanostructure sheet having a sheet resistance that is less than 5,000 Ohm/square and a transparency that passes at least 75% of light incident upon the sheet.

16. The method of claim 1, wherein depositing a molecular joining material includes depositing a joining material having a Fermi level that is less than a Fermi level of at least one of the nanostructures.

17. The method of claim 1, wherein depositing a molecular joining material includes depositing a joining material configured to transport charge to at least one of the nanostructures.

18. The method of claim 1, wherein depositing a molecular joining material includes depositing a joining material configured to transport sufficient charge to reduce a resistance value between the nanostructures by at least 20%.

19. The method of claim 1, wherein nucleating the joining material to form a nucleated material between the nanostructures and physically couple the nanostructures together includes using surface energy characteristics at a junction between the nanostructures, relative to surface energy at other portions of the nanostructures, to facilitate selective nucleation of the joining material at the junction.

20. The method of claim 1, further including, after nucleating the joining material, using the nucleated material as a nucleation site to continue growing the joining material along a sidewall of at least one of the nanostructures.

21. The method of claim 1, wherein depositing a molecular joining material includes depositing a fullerene-based joining material, and nucleating the joining material includes nucleating the fullerene-based joining material to form a nucleated fullerene-based material between the nanostructures to physically couple the nanostructures together.

22. The method of claim 1, wherein nucleating the joining material includes forming a conductive structure at a physical junction between the nanostructures to electrically couple the nanostructures at an electrical resistance that is substantially less than an electrical resistance between the nanostructures at the junction, prior to forming the conductive structure.

23. The method of claim 1, wherein nucleating the joining material includes forming a conductive structure at a physical junction between the nanostructures to electrically couple the nanostructures at an electrical resistance that is an order of magnitude less than an electrical resistance between the nanostructures at the junction, prior to forming the conductive structure.

24. The method of claim 1, wherein depositing a molecular joining material includes depositing the joining material at a junction between carbon-based nanotubes, and nucleating the joining material includes forming a charge transport structure at a physical junction between the carbon-based nanotubes to conductively couple the carbon-based nanotubes.

25. The method of claim 1, wherein nucleating the joining material includes forming a charge transport structure at a physical junction between the nanostructures and that contacts an area of each of the nanostructures that is greater than a contact area between the nanostructures at the junction, prior to depositing the joining material.

26. The method of claim 1, wherein depositing a molecular joining material includes depositing joining materials at junctions between a multitude of nanostructures, and nucleating the joining materials to physically couple the nanostructures together includes joining the nanostructures together to form a conductive film including the nanostructures.

27. The method of claim 1, further including doping at least one of the nanostructures with dopant material from the nucleated joining material.

28. The method of claim 1, wherein depositing a molecular joining material includes depositing joining materials at a junction between at least one of: two semiconducting nanotubes, two metallic nanotubes, a semiconducting nanotube and a metallic nanotube, and nanotubes of different bandgaps, and nucleating the joining material includes physically joining and electrically connecting the nanostructures.

29. The method of claim 1, wherein nucleating the joining material includes doping the nanostructures with the nucleated joining material.

30. The method of claim 1, further including depositing a dopant material on the nanostructures, and nucleating the joining material includes nucleating the dopant material to dope the nanostructures.

31. The method of claim 1, further including depositing a halogenated fullerene material on the nanostructures, wherein nucleating the joining material includes nucleating the halogenated fullerene material to dope the nanostructures.

32. The method of claim 1, further including depositing a fluorinated fullerene material on the nanostructures, wherein nucleating the joining material includes nucleating the fluorinated fullerene material to dope the nanostructures.

33. The method of claim 1, wherein nucleating the joining material includes foil ling a nanowire from the joining material, the nanowire extending along and physically and electrically coupling the nanostructures.

34. The method of claim 1, wherein depositing a molecular joining material includes depositing a joining material between two nanostructures that do not contact one another, and nucleating the joining material includes forming a hybrid material at a nucleated junction that physically and electrically connects said two nanostructures.

35. The method of claim 1, wherein depositing a molecular joining material includes depositing a molecular joining material having a Fermi level that is below the Fermi level of the nanostructures, and further including doping at least one of the nanostructures with a p-type dopant material from the nucleated joining material.

36. The method of claim 1, wherein depositing a molecular joining material includes depositing a molecular joining material having a Fermi level that is above the Fermi level of the nanostructures, and further including doping at least one of the nanostructures with an n-type dopant material from the nucleated joining material.

37. The method of claim 1, wherein the step of depositing includes depositing the non-alloy molecular joining material between metallic nanostructures and doped semiconducting nanostructures.

38. The method of claim 1, wherein the step of depositing includes depositing the non-alloy molecular joining material between metallic nanostructures and doped semiconducting nanostructures, and the step of nucleating the joining material includes forming a nucleated joining material between a metallic nanostructure and a doped semiconducting nanostructure.

39. The method of claim 1, wherein the step of depositing includes depositing the non-alloy molecular joining material between metallic nanostructures and doped semiconducting nanostructures, the doped semiconducting nanostructures having a dopant material that is the same as a material in the joining material.

40. The method of claim 1, wherein the step of nucleating the joining material a includes forming a transparent film that passes at least 40% of light incident upon the film.

41. The method of claim 1, wherein nucleating the joining material to form a nucleated material between the nanostructures and physically couple the nanostructures together includes junctions between the nanostructures, including junctions between two semiconducting nanotubes, between two metallic nanotubes, and between a semiconducting nanotube and a metallic nanotube.

42. A method for joining nanostructures to form a nanomaterial film, the method comprising: depositing a joining material between a plurality of nanostructures; nucleating the joining material to form conductive material at junctions to physically couple the nanostructures together to form the nanomaterial film; using the conductive material at the junctions as a nucleation site, growing additional conductive material along the nanostructures; and doping the nanostructures, using dopant material in the additional conductive material, to reduce a resistance value of the nanostructures relative to a resistance value of the nanostructures, prior to doping the nanostructures.

43. The method of claim 42, wherein depositing a joining material includes selecting a transparency for the nanomaterial film, in response to the selected transparency, determining an amount of joining material to deposit, and depositing the joining material in the determined amount.

44. The method of claim 42, wherein depositing a joining material includes selecting a transparency for a device in which the nanomaterial film is to be implemented, in response to the selected transparency, determining an amount of joining material to deposit, and depositing the joining material in the determined amount to set the transparency of the device.

45. The method of claim 42, wherein depositing a joining material includes at least one of depositing a material from a solution and depositing a material from a vapor.

46. A method for joining carbon-based nanostructures to form a nanomaterial film, the method comprising: depositing a joining material at junctions between a plurality of carbon-based nanostructures; nucleating the deposited joining material to form charge transport structures at a majority of the junctions to physically couple the carbon-based nanostructures, and to electrically couple the carbon-based nanostructures, to form the nanomaterial film; using the charge transport structures as a nucleation site, growing conductive material at the junctions and along a sidewall of the carbon-based nanostructures; and doping the junctions and sidewalls of the carbon-based nanostructures with a dopant from the conductive material; forming a hybrid material including a material from the carbon-based nanostructures and at least one of the joining material and the dopant, the hybrid material and exhibiting a resistance value that is less than a resistance value of the carbon-based nanostructures, prior to formation of the hybrid material.

47. The method of claim 46, wherein forming a hybrid material includes forming a hybrid material having a spectroscopic signature that is substantially different than the spectroscopic signature of the carbon-based nanostructures and the at least one of the joining material and the dopant.

48. The method of claim 46, wherein forming a hybrid material includes forming a hybrid material having an electronic band structure that is substantially different than the electronic band structure of the carbon-based nanostructures and the at least one of the joining material and the dopant.

49. The method of claim 46, wherein nucleating the deposited joining material to form a charge transport structure includes forming a charge transport structure at a physical junction between the carbon-based nanostructures, to electrically couple the carbon-based nanostructures at an electrical resistance that is substantially less than an electrical resistance between the carbon-based nanostructures at the junction, prior to forming the charge transport structure.

50. The method of claim 46, wherein depositing a joining material includes selecting a thickness of the joining material to set a transparency of the nanomaterial film, and depositing the joining material at the selected thickness on the junctions, and nucleating the deposited joining material includes joining the carbon-based nanostructures to form a transparent electrode having the set transparency.

51. The method of claim 46, wherein nucleating the deposited joining material to form a charge transport structure includes forming a charge transport structure configured to electrically couple the carbon-based nanostructures at a conductivity that is at least ten times a conductivity between the carbon-based nanostructures, prior to depositing and nucleating the joining material.

52. The method of claim 46, wherein nucleating the deposited joining material includes selectively nucleating portions of the deposited material that are in contact with the carbon-based nanostructures.

53. The method of claim 46, wherein depositing a joining material at junctions between a plurality of carbon-based nanostructures includes depositing a joining material at a junction between at least one of two semiconducting nanotubes, two metallic nanotubes, and a semiconducting nanotube and a metallic nanotube, and nucleating the deposited joining material to form charge transport structures at each of the junctions to physically couple the carbon-based nanostructures includes physically coupling the nanotubes.

54. The method of claim 46, wherein depositing a joining material at junctions between a plurality of carbon-based nanostructures includes depositing a joining material at junctions between semiconducting carbon nanotubes and metallic carbon nanotubes, nucleating the deposited joining material to form charge transport structures at each of the junctions to physically couple the carbon-based nanostructures includes physically coupling the semiconducting carbon nanotubes with the metallic carbon nanotubes, and nucleating the deposited joining material to form a hybrid material on sidewalls of the carbon-based nanostructures includes doping the sidewalls of the semiconducting carbon nanotubes to form metallic carbon nanotubes.

55. The method of claim 54, wherein doping the sidewalls of the semiconducting carbon nanotubes to form metallic carbon nanotubes includes converting substantially all of the semiconducting carbon nanotubes to metallic carbon nanotubes.

56. The method of claim 46, wherein nucleating the deposited joining material includes forming a continuous structure with the nucleated joining material across a plurality of the carbon-based nanostructures.

\* \* \* \* \*

UNITED STATES PATENT AND TRADEMARK OFFICE
CERTIFICATE OF CORRECTION

PATENT NO.        : 8,524,525 B2                                Page 1 of 1
APPLICATION NO.   : 13/011352
DATED             : September 3, 2013
INVENTOR(S)       : LeMieux et al.

It is certified that error appears in the above-identified patent and that said Letters Patent is hereby corrected as shown below:

In the Claims

Col. 17, line 43, Claim 33: "foil ling" should read --foiling--.

Col. 18, line 15, Claim 40: "material a includes" should read --material includes--.

Signed and Sealed this
Nineteenth Day of May, 2015

Michelle K. Lee
*Director of the United States Patent and Trademark Office*